(12) United States Patent
Luskind et al.

(10) Patent No.: US 10,237,965 B2
(45) Date of Patent: Mar. 19, 2019

(54) SYMMETRICAL AND ORTHOGONAL COMPONENT DESIGN

(71) Applicant: iS5 Communications Inc., Mississauga (CA)

(72) Inventors: Yuri Luskind, Thornhill (CA); Guang Zeng, Mississauga (CA); Clive Dias, Brampton (CA)

(73) Assignee: iS5 Communications Inc., Mississauga, Ontario (CA)

( * ) Notice: Subject to any disclaimer, the term of this patent is extended or adjusted under 35 U.S.C. 154(b) by 0 days.

(21) Appl. No.: 15/440,605

(22) Filed: Feb. 23, 2017

(65) Prior Publication Data
US 2018/0242442 A1    Aug. 23, 2018

(51) Int. Cl.
*H05K 1/02*  (2006.01)
*G06F 1/20*  (2006.01)
*H05K 7/20*  (2006.01)

(52) U.S. Cl.
CPC .......... *H05K 1/0203* (2013.01); *G06F 1/203* (2013.01); *H05K 7/20709* (2013.01)

(58) Field of Classification Search
CPC ... H05K 1/0203; H05K 7/20709; G06F 1/203
See application file for complete search history.

(56) References Cited

U.S. PATENT DOCUMENTS

| 4,771,365 A * | 9/1988 | Cichocki | H05K 7/1421 165/80.3 |
| 6,046,906 A * | 4/2000 | Tseng | H05K 7/1431 165/185 |
| 6,219,239 B1 * | 4/2001 | Mellberg | H05K 7/1431 165/80.3 |
| 9,781,821 B2 * | 10/2017 | Chen | H05K 1/0203 |
| 9,894,803 B1 * | 2/2018 | Artis | H05K 7/20336 |
| 2004/0156180 A1 * | 8/2004 | Westerinen | G06F 1/20 361/818 |
| 2007/0145574 A1 * | 6/2007 | Colbert | H01L 23/3672 257/721 |
| 2008/0239678 A1 * | 10/2008 | Ploeg | H01L 23/40 361/719 |
| 2010/0097767 A1 * | 4/2010 | Jude | H05K 7/20409 361/709 |
| 2010/0290186 A1 * | 11/2010 | Zeng | H05K 7/20545 361/694 |
| 2011/0149518 A1 * | 6/2011 | Salamon | H05K 7/20454 361/704 |
| 2011/0286179 A1 * | 11/2011 | Motschman | G06F 1/20 361/679.54 |

(Continued)

*Primary Examiner* — David M Sinclair
*Assistant Examiner* — Robert D Brown
(74) *Attorney, Agent, or Firm* — Fasken Martineau DuMoulin LLP

(57) ABSTRACT

The present invention relates an environmentally robust chassis design for use in high demand or mission critical environments, including power stations, sub-stations, roadside transportation, rail, and industrial applications. The present invention provides a) increased cooling and reliability for the components of electronic equipment, more particularly electronic components, which could affect the power supply, data transmission; and b) increased tolerance to excessive shock and vibration (e.g. can withstand over 20 G of force).

11 Claims, 7 Drawing Sheets

(56) References Cited

U.S. PATENT DOCUMENTS

| | | | |
|---|---|---|---|
| 2012/0099275 A1* | 4/2012 | Regnier | H05K 7/20145 361/690 |
| 2012/0127665 A1* | 5/2012 | Prete | G06F 1/20 361/704 |
| 2013/0328466 A1* | 12/2013 | Chang | G06F 1/181 312/236 |
| 2014/0118920 A1* | 5/2014 | Ng | G06F 1/20 361/679.33 |
| 2014/0355218 A1* | 12/2014 | Vinciarelli | H01R 43/205 361/728 |
| 2015/0062818 A1* | 3/2015 | Horii | G06F 1/1616 361/697 |
| 2017/0064868 A1* | 3/2017 | Rush | F28F 13/003 |
| 2017/0257966 A1* | 9/2017 | Rozzi | H05K 7/1424 |
| 2017/0339805 A1* | 11/2017 | Lassini | H05K 7/20854 |
| 2018/0049307 A1* | 2/2018 | de Bock | H05K 1/0203 |

\* cited by examiner

SYMMETRICAL AND ORTHOGONAL COMPONENT DESIGN

FIELD OF INVENTION

The present invention relates to electronic systems for use in high demand or mission critical environments, including power stations, sub-stations, roadside transportation, rail, and industrial applications. An environmentally robust chassis design is disclosed (e.g. compliant to most advanced industrial and military applications). The present invention provides a) increased cooling and reliability for the components of electronic equipment, more particularly electronic components, which could affect the power supply, data transmission; and b) increased tolerance to excessive shock and vibration (e.g. can withstand over 20 G of force).

BACKGROUND TO THE INVENTION

Currently, manufacturers of networking equipment and other electronic systems employ a "modular" chassis design that allows the construction of replaceable "line cards" or "cards" with varying functionalities. Accordingly, each customer can purchase and fill their modular chassis with cards that have the required functionality to meet their particular desires. Modular chassis and their associated cards allow customers flexibility, the ability to easily expand capability, the ability to easily switch functionality, and a number of other benefits. Most cards have the same overall requirements with respect to power and other essentials provided by the chassis. Therefore, numerous cards may be designed in the same manner with the same chassis interface.

In mission critical or high demand environments, it is necessary to have modular chassis or platform designs that have increased functionality requirements along with decreased costs and increased reliability. In such environments, the electrical components within these chassis or platforms may generate or be exposed to large fluctuations in temperature (such as, for example, approximately −40° C. to approximately +85° C. ambient temperature), high vibrational shocks (such as, for example, over approximately 20 G, for shock and acceleration), dust and other environmental hazards. To accommodate these conditions, therefore, specific accommodations are made that are uncommon in noncritical environments, including ridged design, cooling apparatus, and the heat generated by the electrical components. These conventional electronic systems generally use fans or other air moving means to force air flow across the modules in order to dissipate the generated heat. However, these solutions do not always result in cost effective construction while maintaining performance. For example, forced-air cooled modular electronic systems do not operate well in harsh environments for a number of reasons. First, in harsh environmental conditions, it is not always possible to have the fan operational and a fan failure may not become immediately apparent, which may cause other components to fail before the fan failure is noticed. Second, in harsh environmental conditions, which tend to also be dirty conditions, the air generally has dust and other airborne contaminants contained therein, such that perpetually forcing air around delicate electronic components may eventually cause undesired failures. These chassis designs must therefore be able to provide heat dissipation and withstand vibration shock but still be able to provide the necessary functionality.

Furthermore, in addition to protecting the electrical components against harsh environmental conditions, including dust vibration, dirt and heat, it is also desirable to protect the electrical devices from shock and vibration. An acute shock, or prolonged vibration, may lead to failure of highly sensitive electronic devices.

There remains a critical need for proper environmental (temperature ranges, vibration, dust, etc.) management for the successful operation of many types of devices, particularly in mission critical environments. Accordingly, there is a need in the art to provide a modular electronic system with reliability which can operate in harsh environments. There is also a need in the art for a modular electronic system which is resistant to environmental conditions, such as dirt, heat vibration and shock.

SUMMARY OF THE INVENTION

Accordingly, it is an object of this invention to at least partially overcome some of the disadvantages of the prior art. Also, it is an object of this invention to provide an improved type of modular electronic system which is passively cooled and provides for increased rigidity at decreased costs.

An aspect of the present invention comprises a mission critical chassis for electronic components, the chassis having: (a) a heatsink having a base and a set of fins extending from the base; (b) a circuit board in thermal contact with the base of the heatsink; and (c) at least one line card guide affixed to the heat sink; wherein the set of fins of the heatsink extend vertically away from the motherboard.

Another aspect of the present invention comprises a mission critical chassis for electronic components, the chassis having: (a) a first heatsink having a first base and a first set of fins extending from the base; (b) a second heat sink having a second base and second set of fins extending from the base; (c) a circuit board disposed between the upper and lower heatsink and in thermal contact with the first and second bases; and (d) a line card guide affixed to the first and second heatsink; wherein the fins of the first and second heatsink extend vertically away from each other and away from the circuit board.

Yet another aspect of the present invention comprises a mission critical chassis for electronic components, the chassis having: (a) a heatsink having a first base and a first set of fins extending from the first base and a second base and a second set of fins extending from the second base and a linking portion extending between the first and second base; (c) a circuit board disposed between the first and second base of the heatsink; and (d) a line card guide affixed to the linking portion; wherein the fins of the first and second base extend vertically away from each other and away from the motherboard.

Yet another aspect of the present invention comprises a mission critical chassis for electronic components, the chassis having: (a) a heatsink having a first base and a first set of fins extending from the first base and a second base and a second set of fins extending from the second base and a linking portion extending between the first and second base adapted to receive a circuit board disposed between the first and second base; (c) a line card guide attached to the linking portion; wherein the fins of the first and second base extend vertically away from each other.

Yet another aspect of the present invention comprises a chassis, wherein the line card guide has a vertical axis and the heatsink has a horizontal axis perpendicular to the vertical axis of the line card guide.

Yet another aspect of the present invention comprises a chassis wherein the horizontal axis of the heatsink is parallel to the first and second base.

Yet another aspect of the present invention comprises a chassis wherein the first and second set of fins extend vertically away from the first and second base perpendicular to the horizontal axis of the heatsink.

Yet another aspect of the present invention comprises a chassis wherein the heatsink employs conduction cooling.

Yet another aspect of the present invention comprises a chassis wherein the first and second bases are directly in thermal contact with the circuit board through thermally conductive material.

Yet another aspect of the present invention comprises a chassis wherein the thermally conductive material further comprises gap pads.

Yet another aspect of the present invention comprises a chassis wherein the first and second bases are in direct or indirect contact with at least one heat generating component of the circuit board.

Yet another aspect of the present invention comprises a chassis wherein the circuit board is a motherboard.

Yet another aspect of the present invention comprises a chassis wherein the motherboard has a first and second portion with at least one heat generating component on each of the first and second portions.

Yet another aspect of the present invention comprises a chassis wherein the at least one heat generating component is selected from the group consisting of a CPU, Switching Fabric and Power Supplies.

Yet another aspect of the present invention comprises a chassis wherein the first base, second base and linking portion form a U-shaped configuration.

Yet another aspect of the present invention comprises a chassis wherein the bottom of the "U" is disposed towards the front of the chassis.

Yet another aspect of the present invention comprises a chassis wherein the heat sink further comprises a second linking portion.

Yet another aspect of the present invention comprises a chassis wherein the first base, second base, first and second linking portions form an O-shaped configuration.

Yet another aspect of the present invention comprises a chassis wherein the heatsink is a single piece construction.

BRIEF DESCRIPTION OF THE DRAWINGS

In the drawings, which illustrate embodiments of the invention.

DESCRIPTION OF THE PREFERRED EMBODIMENTS

Figure 1:
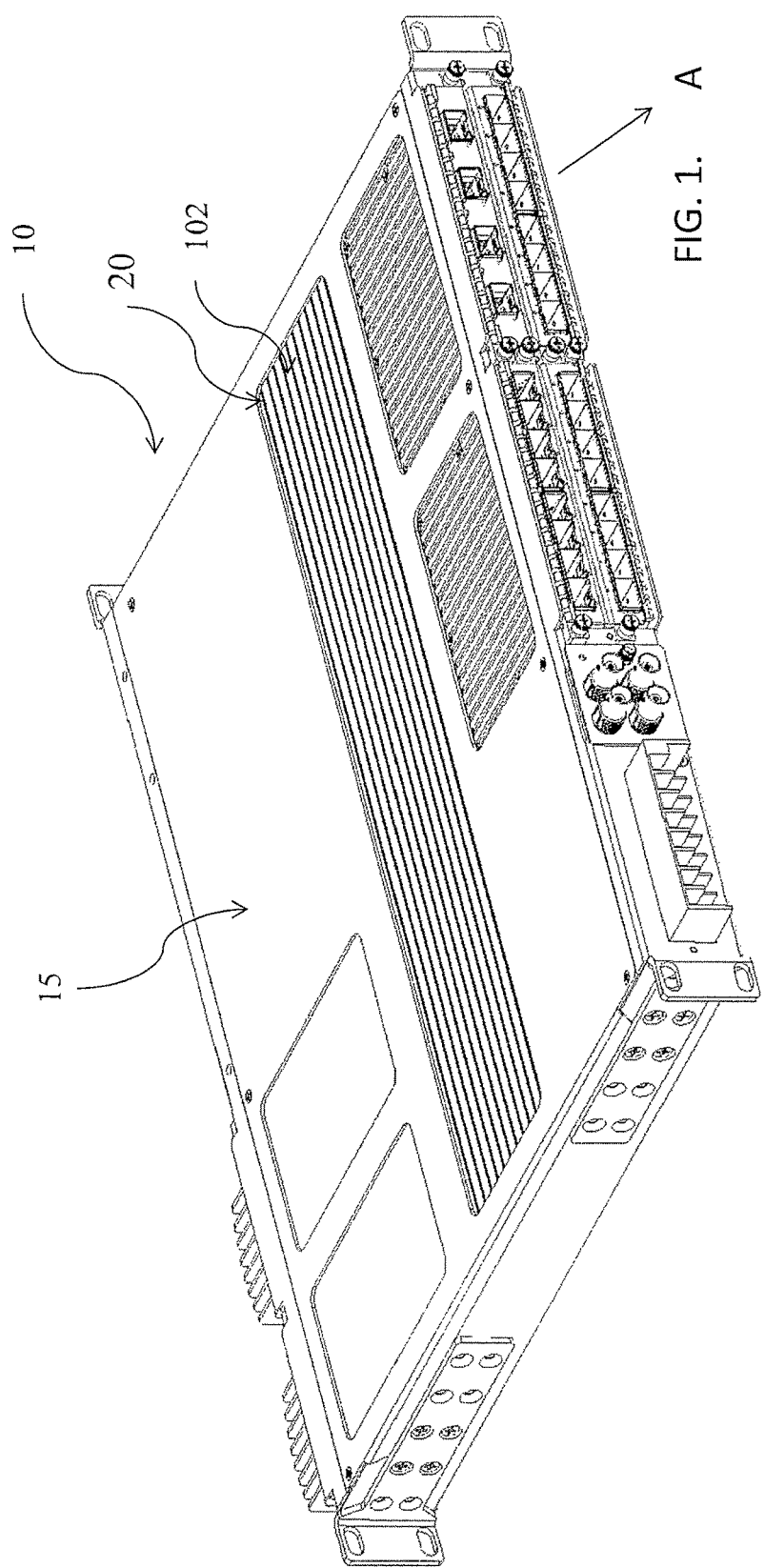
FIG. 1 is a top and front exemplary perspective view of an aspect of the present invention.

The description that follows, and the embodiments described therein, is provided by way of illustration of an example, or examples, of particular embodiments of the principles and aspects of the present invention. These examples are provided for the purposes of explanation, and not of limitation, of those principles and of the invention.

It should also be appreciated that the present invention can be implemented in numerous ways, including as a process, a method, an apparatus, a system, or a device. In this specification, these implementations, or any other form that the invention may take, may be referred to as processes. In general, the order of the steps of the disclosed processes may be altered within the scope of the invention.

Preferred embodiments of the present invention can be implemented in numerous configurations depending on implementation choices based upon the principles described herein. Various specific aspects are disclosed, which are illustrative embodiments not to be construed as limiting the scope of the disclosure. Although the present specification describes components and functions implemented in the embodiments with reference to standards and protocols known to a person skilled in the art, the present disclosures as well as the embodiments of the present invention are not limited to any specific standard or protocol. Each of the standards for mobile computing, including the internet and other forms of computer network transmission (e.g., TCP/IP, UDP/IP, HTML, and HTTP) represent examples of the state of the art. Such standards are periodically superseded by faster or more efficient equivalents having essentially the same functions. Accordingly, replacement standards and protocols having the same functions are considered equivalents.

A person skilled in the art will understand "mission critical" to refer to systems or components, equipment, personnel, processes, procedures, software, etc. associated therewith that are essential to operation. Failure or disruption of such mission critical systems or elements thereof will result in serious impact on operations. Mission critical systems are the systems that are essential to business and operational safety. These are resilient systems with a high degree of availability and performance matching stringent performance requirements. A person skilled in the art would understand that these are set out in various industrial standards, including, for example, AJJ Standard 61850-3 etc.

A person skilled in the relevant art would understand the term "line card" or "card" to refer to any modular electronic component designed to function within a chassis. Those skilled in the art understand that the term "cards", with respect to electronic systems, represents any pluggable printed circuit. Examples of cards include but are not limited to MRV's®; EM316SW-XY 10/100 Ethernet Card, EM316-2XFP-ET Dual XFP Card, and EM316-4SW-R 4-Port Ethernet Switch Card, etc. Electronic systems in different fields and designed for different purposes may include a modular chassis/card format. Line cards or cards are also sometimes referred to as "blades", "modules", "network interface pluggables" and the general term "card" is meant to encompass devices that go by all such names.

A person skilled in the relevant art would understand the term "circuit" or "printed circuit" to refer to printed circuit boards ("PCB") which mechanically supports and electrically connects electronic components using conductive tracks, pads and other features etched from copper sheets laminated onto a non-conductive substrate. PCBs can be single sided (one copper layer), double sided (two copper layers) or multi-layered (outer and inner layers). A person skilled in the relevant art will understand that a "motherboard" (sometimes alternatively known as the mainboard, system board, baseboard, planar board or logic board, or colloquially, a "mobo") generally refers to the main PCB found in general expandable chassis systems.

In preferred embodiments of the present invention, there is typically provided an assembly which includes a primary, or host, card having a multi-electrode electrical or electromechanical connectors for establishing, for example, peripheral component interconnect ("PCI") bus connections (or similar connections known in the art, such as, for example, any other interfaces like Ethernet, i2C, SMI, CPU peripheral Bus etc.) within a motherboard of a chassis. Secondary, or mezzanine, cards may be electrically connected with the primary card via PCI Mezzanine Card (PMC) or switched mezzanine card (XMC) connectors disposed between the cards. A person skilled in the art will understand that the invention is not limited to any specific configuration and the elements listed herein are provided as preferred examples or embodiments.

A person skilled in the relevant art will understand that the term "heat sink" (or "heatsink") is a passive heat exchanger that transfers the heat generated by an electronic device to another medium, typically air, so as to be dissipated away from the device, thereby allowing regulation of the device's temperature at optimal levels. A heat sink is designed to maximize its surface area in contact with the cooling medium surrounding it (e.g. air). Air velocity, choice of material, protrusion design, surface treatment, etc. are factors that affect the function of the heat sink. Embodiments of the present invention incorporate heat sinks of known design, which may vary depending on the specific use of the embodiment of the present invention. A heat sink can be made out of a variety of materials, including, but not limited to, copper and/or aluminium. In a preferred embodiment of the present invention, extruded aluminium is used in the heat sink. In other embodiments, copper may be used because it has many desirable properties for thermally efficient and durable heat exchangers. Aluminum is used in applications where weight is a concern.

Elements of the present invention may be implemented with computer systems which are well known in the art. Generally speaking, computers include a central processor, system memory, and a system bus that couples various system components (typically provided on cards), including the system memory, to the central processor. A system bus may be any of several types of bus structures including a memory bus or memory controller, a peripheral bus, and a local bus using any of a variety of bus architectures. The structure of a system memory may be well known to those skilled in the art and may include a basic input/output system (BIOS) stored in a read only memory (ROM) and one or more program modules such as operating systems, application programs and program data stored in random access memory (RAM). Computers may also include a variety of interface units and drives for reading and writing data. A user or member can interact with computers with a variety of input devices, all of which are known to a person skilled in the relevant art. Computers can operate in a networked environment using logical connections to one or more remote computers or other devices, such as a server, a router, a network personal computer, a peer device or other common network node, a wireless telephone or wireless personal digital assistant. The computer of the present invention may include a network interface that couples the system bus to a local area network (LAN). Networking environments are commonplace in offices, enterprise-wide computer networks and home computer systems. A wide area network (WAN), such as the Internet, can also be accessed by the computer or mobile device. Computers can operate in a networked environment using logical connections to one or more remote computers or other devices, such as a server, a router, a network personal computer, a peer device or other common network node, a wireless telephone or wireless personal digital assistant. The computer of the present invention may include a network interface that couples the system bus to a local area network (LAN). Networking environments are commonplace in offices, enterprise-wide computer networks and home computer systems. A wide area network (WAN), such as the Internet, can also be accessed by the computer or mobile device.

One skilled in the relevant art would appreciate that the device connections mentioned herein are for illustration purposes only and that any number of possible configurations and selection of equipment and devices, including cards, peripheral devices, etc. could be coupled to the computer system.

One skilled in the relevant art would understand that the term "chassis" in association with an electronic device comprises a frame or other internal and/or external supporting structure on which the circuit boards and other electronics are mounted. In some designs, such as older sets, the chassis is mounted inside a heavy, rigid cabinet, while in other designs such as modern computer cases, lightweight covers or panels may be attached to the chassis. Such mountable chassis typically are referred to as "rack mountable" chassis. The combination of chassis and outer covering may be called an enclosure. In a preferred embodiment of the present invention, the enclosure typically has a well-known and standardized width (e.g. about 19 or about 23 inches) for mounting in standard-sized racks, and a height of about 19 inches, but it will be understood that any configuration is possible depending on the standardized or non-standardized frame or enclosure for mounting multiple chassis or modules. The 19-inch dimension may also include the edges, or "ears", that protrude on each side which allow the module to be fastened to the rack frame with screws. The height of the electronic modules or chassis to be inserted into the rack is also standardized as multiples of 1.752 inches (44.50 mm) or one rack unit or U or RU.

The enclosure may also include a "back plane" having connectors for receiving mating connectors on the line cards, to couple the line cards to a back plane. It will be understood, however, that the dimensions of a chassis used in the present invention can vary to meet the requirements of where the component is to be placed.

Some portions of the detailed descriptions that follow are presented in terms of procedures, steps, logic block, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc. may be here, and generally, conceived to be a self-consistent sequence of operations or instructions leading to a desired result. The operations are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers or the like.

The present invention relates to electronic equipment (e.g. data transfer devices) chassis and methods of using the same. More particularly, the present invention is directed to a chassis that allows the installation and use of line cards with various different form factors, and power and data requirements. The embodiments of the present invention provide for a generally symmetrical and orthogonal relationship between components of the chassis, preferable one or more heat sinks, and one or more line card guides. In a preferred embodiment, one or more first components (e.g. a heat sink) is intersecting or lying at right angles (e.g. orthogonal) to one or more second components (e.g. line card guides). In addition to the orthogonal relationship set out above, the components are also symmetrical along a horizontal axis of the chassis. This symmetrical and orthogonal relationship provides for increased stability and reliability.

Figure 2:
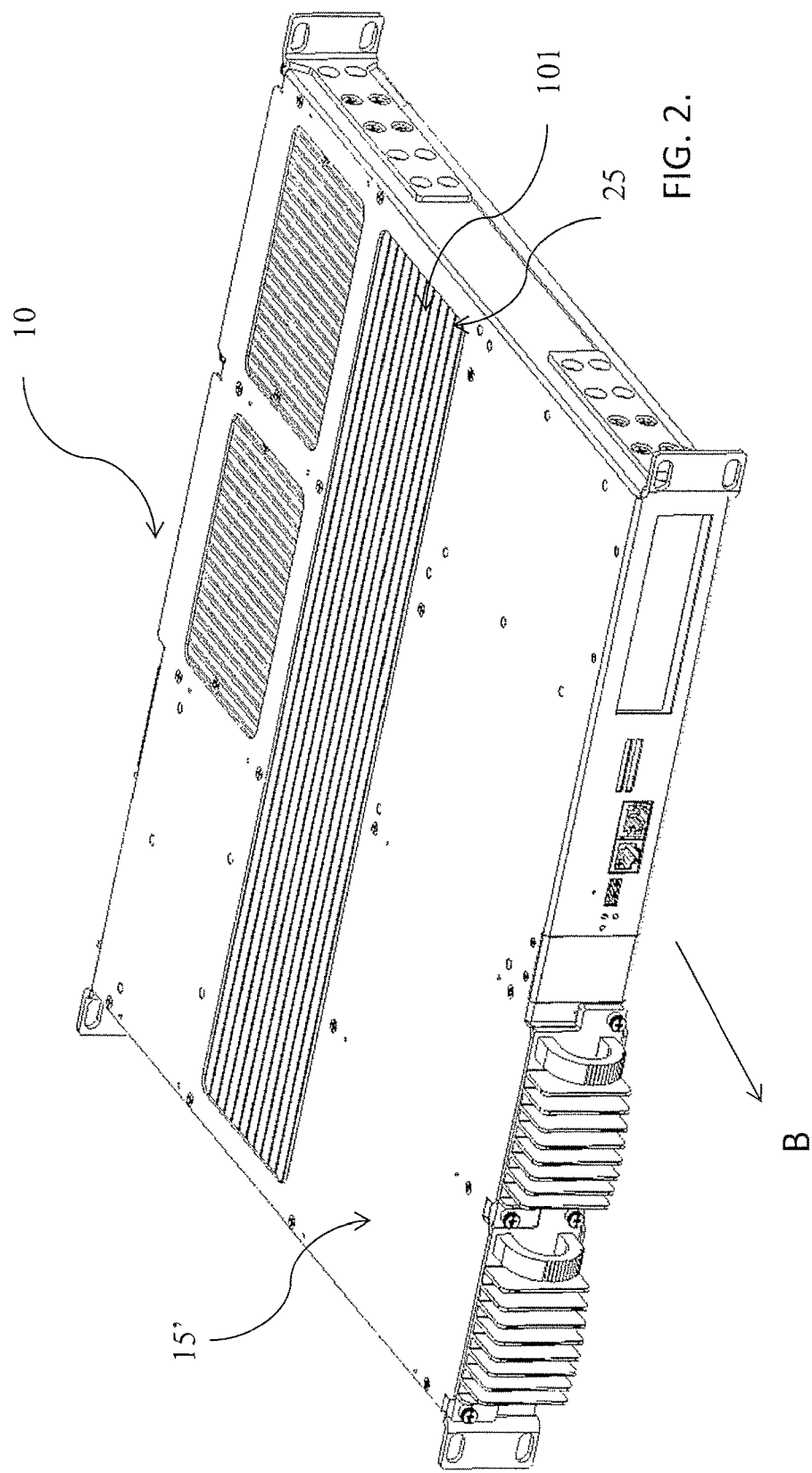
FIG. 2 is a bottom and rear exemplary perspective view of an aspect of the present invention.

In the description and drawings herein, and unless noted otherwise, the terms "vertical", "horizontal", "up", "down", "front" and "back" typically refer to a Cartesian co-ordinate systems in which the vertical direction generally extends in an "up and down" orientation (y-axis) from bottom to top of the page. The "up and down" orientation may also be used to refer to the "top" and "bottom" portions of embodiments of the present invention. The horizontal direction generally extends in a "left to right" or "side to side" orientation (x-axis). In addition, the "front and back" orientations may extend in an orientation that may extend out from or into the page (z-axis). The "front and back" orientation may also be used to refer to the "rear" and "leading" portions of embodiments of the present invention. For example, FIG. 1 provides that the front or leading portions of the chassis showing the various network interfaces or pluggable components generally extend outward from the page (as shown by the arrow A), while FIG. 2, provides that the back or rear portions of the chassis showing the various electromechanical or power components generally extend outward from the page (as shown by the arrow B). It will be understood that the "front" portion of the chassis may be referred to as the networked or network side portion.

FIGS. 1 and 2 illustrate embodiments of the present invention. As shown in FIGS. 1 and 2, there is provided front and back perspective views of embodiments of the present invention. FIG. 1 provides a perspective view of the top of the chassis. FIG. 2 provides a perspective view of the bottom of the chassis. As shown in FIGS. 1 and 2, there is provided enclosure 10 which preferably includes a number of components (not shown as they are covered by cover 15) found in electronic devices, many of which would be known to a person skilled in the relevant art, and disposed therein in chassis 100. The enclosure, also referred to as a chassis or case, is the physical frame or structure of the multi-component device. A person skilled in the relevant art will understand that the chassis houses the main electronic and/or electro-mechanical components, including, but not limited to, the motherboard (with places to insert or replace microchips for the main and possibly specialized processors), RAM, etc. and places for adding optional adapters. The actual electronic or electromechanical components are not an aspect of the present invention such components will typically be dictated by the function(s) required.

As shown in FIGS. 1 and 2, in a preferred embodiment, there is provided upper or top vent 20 in upper or top cover 15 which allows for the dissipation of heat though cover 15 and lower or bottom vent 25 in lower or bottom cover 15' which allows for the dissipation of heat though cover 15'. It will be understood that vents 20 and 25 can be of any configuration that would allow for the dissipation of heat. For example, the vents may be simply openings in the cover or may provide for slots or other smaller openings to allow heat to be dissipated through the covers 15, 15' is without losing any structural integrity of covers 15, 15'.

In an embodiment of the present invention, the chassis design of the present invention will have at least one heat sink or heat sink area. In a preferred embodiment, there is provided two heat sinks, which in a preferred embodiment consists of integrated fins that extend vertically from a base portion wherein each of the base portions is in thermal contact with the electrical components contained within the motherboard disposed within the chassis. At the inserted position, an electronic device (e.g. a PCB) is in thermal contact with the one or both of the heat sinks and such heat sinks are oriented towards an upper opening or vent and a lower opening of the chassis. In this way, the heat sink fin area extends vertically to the top or bottom opening forming an air flow path across the heat sink area. While not intending to be restricted to single functional explanation, it is generally understood that a pressure differential built up by heat generated by the electrical components and conducted to the fins of one or more heat sinks builds up an air pressure differential creating convection air currents from the openings in the chassis and enclosure through the heat sink fin areas and out the top opening, and vice-versa. This permits passive dissipation of the heat generated by the electrical components in the chassis.

Figure 3:
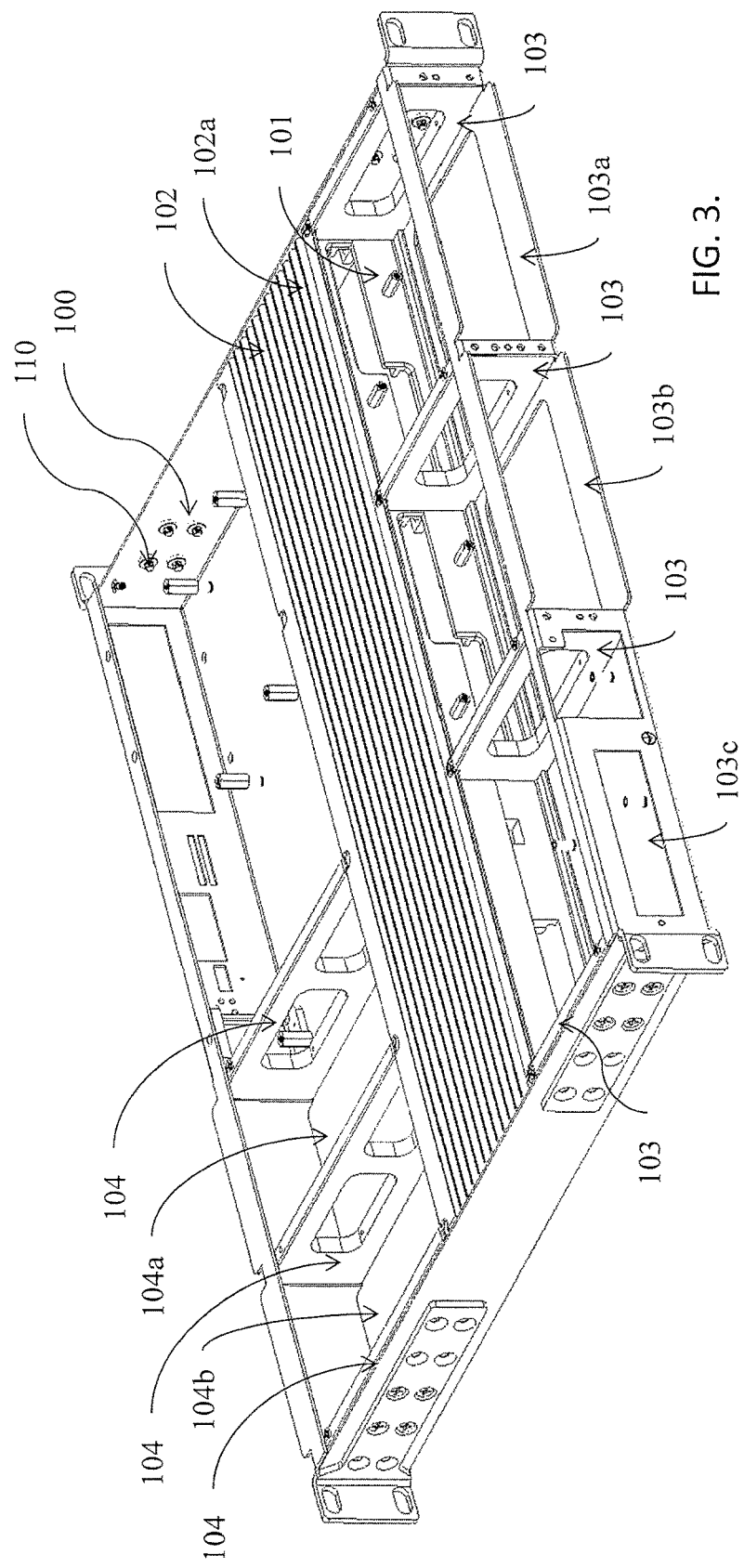
FIG. 3 is top and front perspective view of an aspect of the present invention with the cover removed.

As shown in FIG. 3, there is provided a preferred embodiment of the present invention, in which upper cover 15 of the enclosure 10 has been removed to expose chassis 100. In the preferred embodiment shown in FIG. 3, there is provided lower heat sink 101 (not shown) and upper heat sink 102. A person skilled in the relevant art will understand that the structure of heat sinks 101 and 102 are generally well known in the art so as to function employing conduction cooling. In one aspect, the present invention provides enclosure 10 having openings, holes, or vents therein, such as, for example, at the top (vent 20, bottom (vent 25) and/or sides (see, for example side holes 30, 30', 30", 30'" in FIG. 3)) so as to allow or permit air flow through the enclosure without the use of fans (via conductive cooling). It will be understood, based on the description below, that in a preferred embodiment lower and upper heat sinks 101 and 102 form a "sandwich" configuration in which a motherboard may be sandwiched between the two heat sink portions. The upper and lower heat sinks provide for conductive cooling using, for example, a plurality of fins or extensions 101a and 102a of heat sinks 101 and 102 respectively. As seen in greater detail in FIG. 5A, the plurality of fins 101a, 102a extend vertically away from a base portion 120, 120' of 101, 102 respectively. A person skilled in the relevant art will understand that the structure of heat sinks 101 and 102 are generally well known in the art so as to function employing conduction cooling.

Figure 5A:
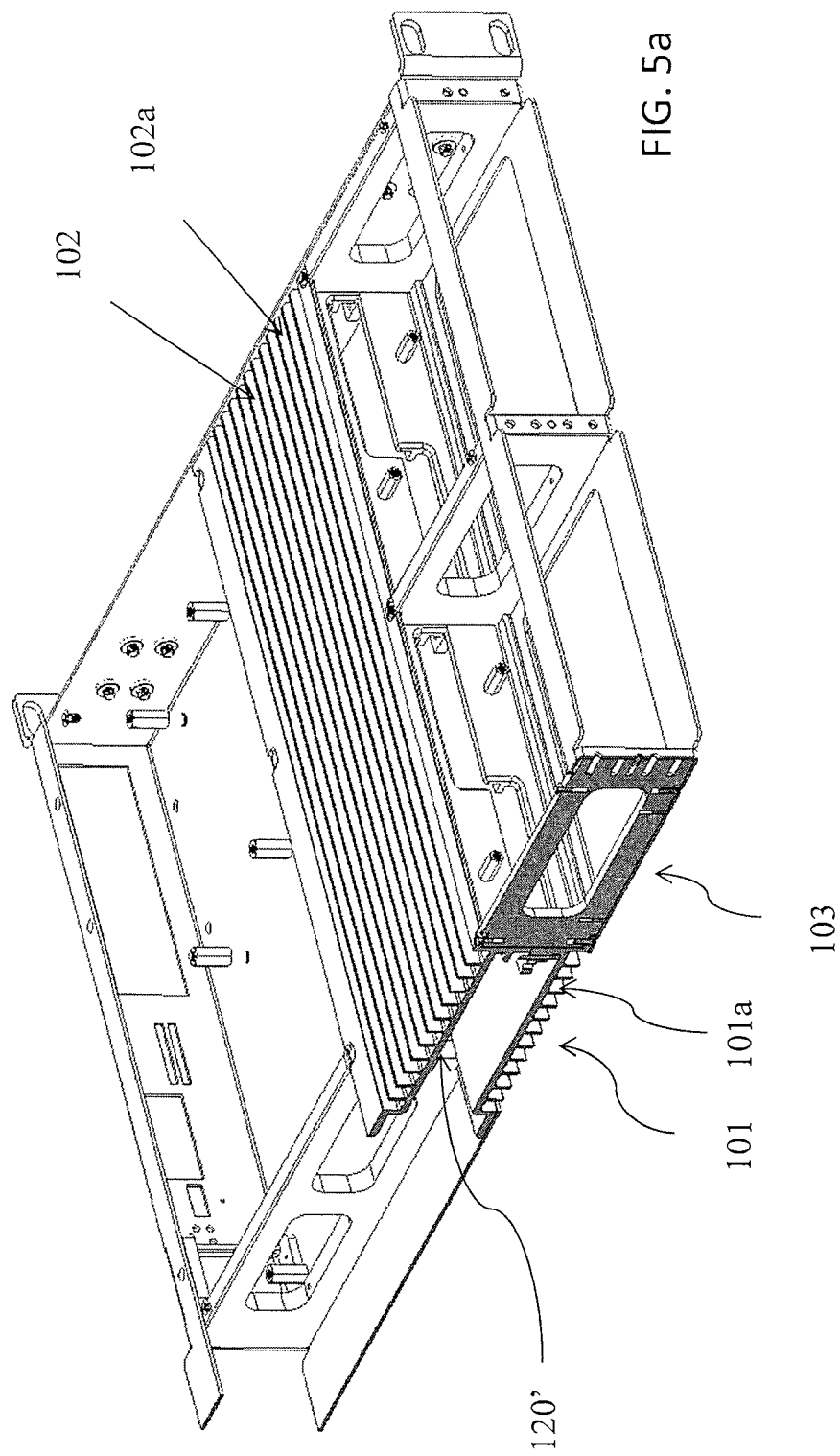
FIGS. 5A and 5B are further embodiments in accordance with the present invention.
Figure 5B:
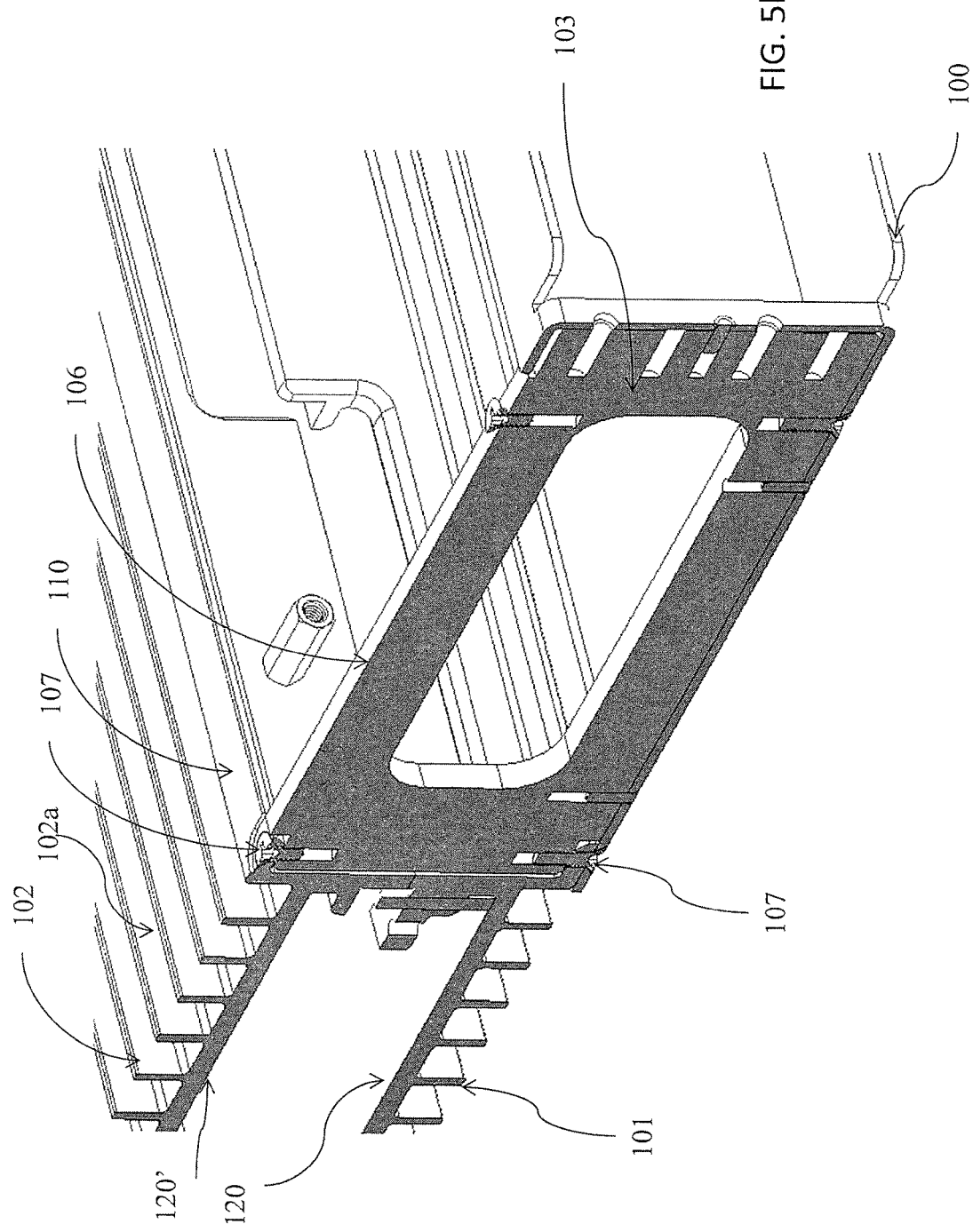
Figure 6:
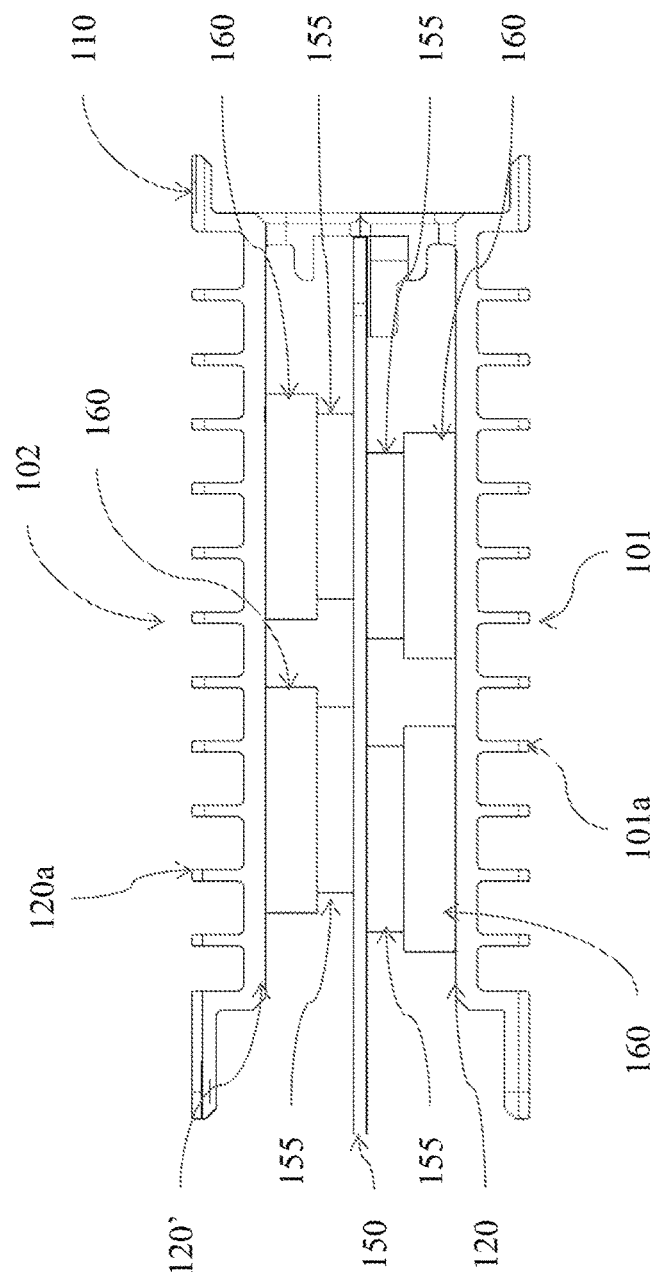
FIG. 6 is a cross-section view of an aspect of the present invention.

The base portions 120 and 120' of heat sinks 101 and 102 function to directly or indirectly (e.g. by incorporating thermally conductive material such as, but not limited to "gap" pads; (see 160 in FIG. 6) engage with an upper and lower portion of a motherboard (see 150 of FIG. 6). In a preferred embodiment, the base portions of heat sinks are in direct or indirect contact with heat generating components of the motherboard (e.g. CPU, Switching Fabric, Power Supplies) (see 155 in FIG. 6), allowing for heat dissipation from both the top and the bottom of the motherboard as electronic components may be provided on both sides of the motherboard. As can be seen in FIGS. 5A and 6 in a preferred embodiment of the present invention, heat sinks 101 and 102 can form a U-shaped configuration with the bottom of the "U" disposed towards the either the rear or the front of the enclosure. In such a configurations, the fins 101a and 102a are oriented away from each other such and the base portions 120, 120' and opposed to one another. With the fins or flanges extending vertical away from each other (e.g. one extending generally vertically upward and one extending generally vertically downward, as shown in FIG. 5B and FIG. 6), the heat sinks 101 and 102 can appear to form a mirror image of each other. It will be understood that additional configurations of the heat sinks, including where the heat sinks have an "O" configuration wherein the top and the bottom of the "O" are oriented towards the front, and the back of the enclosure. It will be further understood that the heat sinks 101 and 102 may be a single piece construction or may be separate pieces fastened together using means known in the art (see for example, FIGS. 5A and 5B).

In a further preferred embodiment of the present invention, there is also provided line guides 103 and 104 in the chassis, which may be fixed at specific positions, or in an alternative embodiment, may be adjustable. Combined with upper heat sink 102 and lower heat sink 101, the line guides may also serve to act as structural elements within the chassis. In addition to the primary heat sink function of 101 and 102, there is a structural function in conjunction with the line card guides 103 and 104. Upper and lower heat sinks provide a structurally stabilizing effect as will be discussed in greater detail below. In a preferred embodiment, upper and lower heat sinks 102 and 101 are attached to, or in the proximity of, the main PCB board or "motherboard", for example.

Figure 4:
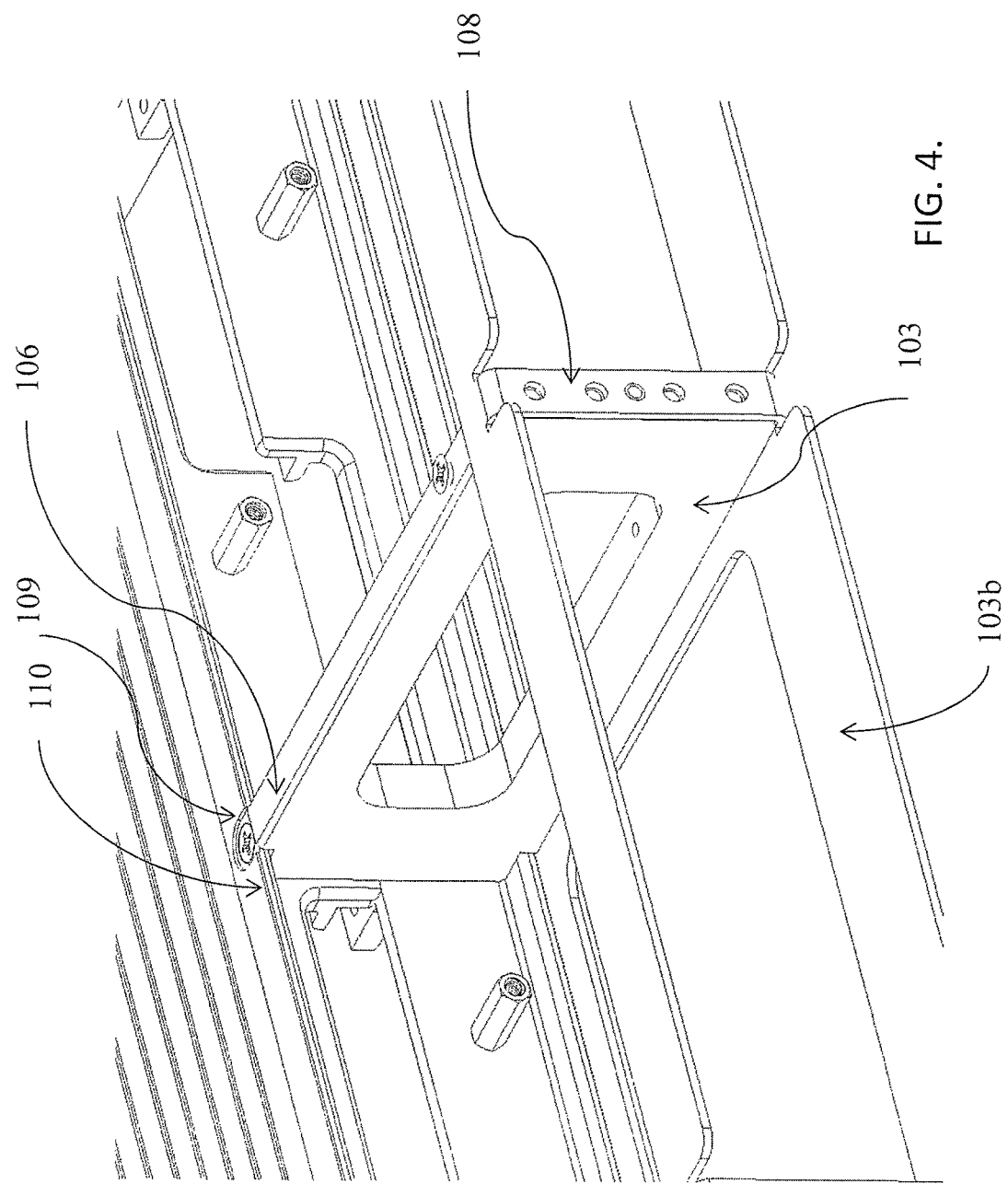
FIG. 4 is an exploded view of a portion of FIG. 3.

As shown in FIG. 3, chassis 100 and line card guides or "guides" 104 and 103 form front and rear accessible circuit board or power unit slots 103a to 103c and 104a, 104b, respectively. The power units may be referred to as "hot" pluggable units. It will be understood by a person skilled in the relevant art that rear line card guides 104 or front line card guides 103 may also be designed to receive power components for the electronic devices provided in enclosure 10 (are "hot" pluggable). The slots 103a,b,c are designed to house one or more line cards that are to be inserted into the chassis and maintained in the enclosure. As shown in FIG. 3 and in greater detail in FIG. 4, the line guides 104 and 103 allow line cards to be secured within the chassis. Line guides 104 and 103 may, in a preferable embodiment of the present invention, be releasably or fixedly attached or fastened to at least one of the heat sinks via an attachment portion. In a preferred embodiment, as shown in FIG. 4, the line cards may be fastened to a heat sink at heat sink attachment points 109 of the attachment flange 110. It will be understood that, in other embodiments of the present invention, one or more of the line card guides may also be removable and/or adjustable. It will be understood that the attachment points 109 may be fixed, movable or provide a wide range of attachment points. For example, attachment point 109 may be formed from a slot that can allow for minor adjustments of the location of the point at which the line card can be fastened to the heat sink attachment flange. It will be understood that the attachment flange 110 is oriented generally perpendicular to the fins 101a or 102a. In the example provided in FIG. 3, chassis 100 can hold up to 10 cards, but it will be understood that any combination of line guides is possible within chassis 100. Alternatively, one or more line card guides can be re-positioned within the card slot to accommodate cards of different widths. Systems can be designed with any number of card guides to divide the space according to the line card portfolio supported by the system. The card guides 103 and 104 are secured to the 100 of the chassis using mounting elements (e.g. screws) well known in the art. As shown in FIG. 3, one or both of the left-most and right-most card guides can optionally be permanently attached to upper wall portions of the chassis.

In an embodiment of the present invention, the card guide 103 can include notches and/or bias members on its side, to guide the line card and secure it in position and engage directly with the upper or lower heat sink. The guide 103 also includes a plurality of engagement portions 106 which have holes 107 disposed therein to attach the guide 103 to the upper and lower heat sinks via attachment flange 110 (see FIGS. 5A and 5B). These can be attached by screws, rivets, self-clinching fasteners, pins, etc. This construction allows for a more rigid (i.e. less flexible) configuration.

As shown in FIG. 3, the right portion of card guide 103 is designed in a mirrored manner to the left portion of card guide 103. The right portion of card guide 103 may include guides on its left side to guide the line card and secure it in position, and a vertical base 108 to attach the guide 103 to the chassis 100 and/or other components. Rivet holes in the guide 103 are used for optionally securing, using rivets, the components together.

Although this disclosure has described and illustrated certain preferred embodiments. As shown in FIG. 1, in a second situation, of the invention, it may be to be understood that the invention may be not restricted to those particular embodiments. Rather, the invention includes all embodiments which are functional or mechanical equivalence of the specific embodiments and features that have been described and illustrated.

We claim:

1. A mission critical chassis for electronic components, the chassis having:
   (a) a single piece construction heatsink having a first base and a first set of fins extending from the first base and a second base and a second set of fins extending from the second base and a first linking portion extending between the first and second base to form a U-shaped configuration, the heatsink having a horizontal axis parallel to the first and second base;
   (c) a motherboard disposed parallel to the horizontal axis of the heatsink having a first and second portion with at least one heat generating component on each of the first and second portions, the motherboard disposed between the first and second base of the heatsink and the at least one heat generating component on the first portion directly in thermal contact with the first base through thermally conductive material, and the at least one heat generating component on the second portion directly in thermal contact with the second base through thermally conductive material; and
   (d) a line card guide affixed to the linking portion, the line card guide having a vertical axis perpendicular to the horizontal axis of the line card guide; and
   wherein the fins of the first and second base extend vertically away from each other and away from the motherboard and perpendicular to the horizontal axis of the heatsink;
   and wherein the bottom of the "U" of the heatsink is disposed towards a front of the chassis.

2. The chassis of claim 1 wherein the heatsink employs conductive cooling.

3. The chassis of claim 2 wherein the thermally conductive material further comprises gap pads.

4. The chassis of claim 3 wherein the at least one heat generating component on each of the first and second portions is selected from the group consisting of a CPU, Switching Fabric, Power Supplies.

5. The chassis of claim 4 wherein the heat sink further comprises a second linking portion.

6. The chassis of claim 5 wherein the first base, second base, first and second linking portions form a O-shaped configuration.

7. The chassis of claim 4 wherein line guide is releasably or fixedly attached to an attachment portion of the heat sink.

8. The chassis of claim 7 wherein the attachment portion of the heatsink is an attachment flange.

9. The chassis of claim 8 wherein the line guide is releasably attached to a slot within the attachment flange.

10. The chassis of claim 9 wherein the attachment flange is oriented generally parallel to the horizontal axis of the heatsink.

11. The chassis of claim 10 further comprising a frame attached to the heat sink, a first cover attached to the frame and having a first vent, a second cover attached to the frame and having a second vent, the first and second vent allowing the dissipation of heat from the first and second set of fins.

* * * * *